(12) United States Patent
Seo et al.

(10) Patent No.: US 9,143,090 B2
(45) Date of Patent: Sep. 22, 2015

(54) OUTPUT VOLTAGE STABILIZATION CIRCUIT OF DISPLAY DEVICE DRIVING CIRCUIT

(75) Inventors: Jung Il Seo, Daejeon-si (KR); Yong Jung Kwon, Cheongju-si (KR); An Young Kim, Daejeon-si (KR); Joon Ho Na, Daejeon-si (KR); Yun Tack Han, Anyang-si (KR); Ji Hun Kim, Daejeon-si (KR); Hyun Min Song, Cheongju-si (KR); Yeong Joon Son, Daejeon-si (KR); Sung Wan Jung, Bucheon-si (KR); Sang Woo Kim, Daejeon-si (KR); Hae Won Lee, Cheongju-si (KR)

(73) Assignee: SILICON WORKS CO., LTD., Daejeon-Si (KR)

( * ) Notice: Subject to any disclaimer, the term of this patent is extended or adjusted under 35 U.S.C. 154(b) by 183 days.

(21) Appl. No.: 13/511,128
(22) PCT Filed: Nov. 19, 2010
(86) PCT No.: PCT/KR2010/008201
§ 371 (c)(1),
(2), (4) Date: May 21, 2012
(87) PCT Pub. No.: WO2011/062442
PCT Pub. Date: May 26, 2011

(65) Prior Publication Data
US 2013/0162618 A1    Jun. 27, 2013

(30) Foreign Application Priority Data

Nov. 23, 2009  (KR) .......................... 10-2009-0112971
Dec. 22, 2009  (KR) .......................... 10-2009-0129028
Jun. 17, 2010  (KR) .......................... 10-2010-0057413
Oct. 1, 2010   (KR) .......................... 10-2010-0095823

(51) Int. Cl.
*G06F 1/26*     (2006.01)
*H03F 1/30*     (2006.01)
(52) U.S. Cl.
CPC *H03F 1/308* (2013.01); *G06F 1/26* (2013.01); *G09G 2310/0275* (2013.01); *G09G 2310/0291* (2013.01); *G09G 2380/02* (2013.01)

(58) Field of Classification Search
CPC .................................... G06F 1/26; G05F 1/10
USPC .................... 345/211–213; 315/169.1–169.4
See application file for complete search history.

(56) References Cited

U.S. PATENT DOCUMENTS 5,066,945  A  *  11/1991  Kanno et al. ................... 345/101
5,243,333  A  *   9/1993  Shiba et al. .................... 345/100

FOREIGN PATENT DOCUMENTS

KR   10-1999-0006011 A    1/1999
KR   10-2004-0019484 A    3/2004

(Continued)

OTHER PUBLICATIONS

PCT International Search Report of PCT Appl. No. PCT/KR2010/008201, dated Jul. 22, 2011.

(Continued)

*Primary Examiner* — Ram Mistry
(74) *Attorney, Agent, or Firm* — Kile Park Reed & Houtteman PLLC

(57) ABSTRACT

The present invention relates to an output voltage stabilization circuit. Specifically, the present invention relates to an output voltage stabilization circuit of a display device driving circuit, which generates a reference current dependent on a high source voltage using a current source independent of a magnitude of the high source voltage, generates a reference current dependent on a low source voltage using a current source independent of a magnitude of the low source voltage, and then generates a control signal by comparing the magnitudes to each other, whereby the output voltage stabilization circuit may stabilize an output voltage regardless of an order in which the low source voltage and the high source voltage are turned off in a circuit using both the low source voltage and the high source voltage.

11 Claims, 11 Drawing Sheets

(56) References Cited

FOREIGN PATENT DOCUMENTS

| KR | 10-2006-0123952 A | 12/2006 |
| KR | 10-2008-0006349 | 1/2008 |
| KR | 10-2008-0010581 | 1/2008 |
| KR | 10-2008-0101772 A | 11/2008 |

OTHER PUBLICATIONS

PCT Written Opinion of the International Search Authority for PCT Appl. No. PCT/KR2010/008201, dated Jul. 22, 2011.

* cited by examiner

OUTPUT VOLTAGE STABILIZATION CIRCUIT OF DISPLAY DEVICE DRIVING CIRCUIT

BACKGROUND OF THE INVENTION

1. Field of the Invention

The present invention relates to an output voltage stabilization circuit, and more particularly, to an output voltage stabilization circuit of a display device driving circuit, which stabilizes an output voltage of the display device driving circuit.

2. Description of the Related Art

In general, an electric paper refers to a display device including a plurality of globular capsules and a plastic transistor arranged over and under the globular capsules. Unlike existing displays using backlights, the electric paper uses reflected light like paper.

An electric paper display device (EPD) has a production cost lower than existing flat display panels. Furthermore, since the EPD does not require backlights and continuous recharging, the EPD exhibits excellent energy efficiency. The EPD may offer a sharper image and a wider viewing angle than liquid crystal displays (LCD). Furthermore, since the EPD has a memory function, previous data stored therein is not lost although power is turned off. Therefore, the EPD may be widely used in bulletin boards, electronic books and so on.

In order for the EPD to maintain previous data, a driving circuit of the EPD should maintain an output at a ground level VSS after power off. In the conventional EPD, however, the output of the driving circuit may not be maintained at the ground level VSS depending on a power-off sequence.

FIG. 1 is a block diagram illustrating the configuration of a driving circuit of a conventional EPD.

Referring to FIG. 1, the driving circuit 100 of the conventional EPD includes a level shifter 110 and an output driver 120.

The level shifter 110 is configured to convert low voltage data LV DATA_1 to LV DATA_3 into high voltage data HV DATA_1 to HV DATA_3 using a low source voltage VCC, a high source voltage VPOS/VNEG, and a bias voltage Vbias_LV, and then provide the converted data to the output driver 120. The output driver 120 is configured to provide an output signal OUTPUT corresponding to the high voltage data HV DATA_1 to HV DATA_2 to a display panel (not illustrated). The output signal OUTPUT includes a ground voltage VSS and a high source voltage VPOS/VNEG.

The low source voltage VCC is a source voltage which is supplied to a low source voltage circuit for inputting a signal to the output driver 120. For example, the low source voltage circuit may include a circuit (not illustrated) for generating the bias voltage Vbias_LV or the level shifter 110 for generating the low voltage data LV DATA_1 to LV DATA_3. The high source voltage VPOS/VNEG is a source voltage supplied to the output driver 120. The high source voltage VPOS/VNEG includes a positive source voltage VPOS and a negative source voltage VNEG.

As illustrated in FIG. 1, the driving circuit of the EPD includes a low source voltage circuit using a low source voltage and a high source voltage circuit using a high source voltage. Among driving circuits, a general logic circuit operates at a low source voltage, and an output circuit for driving a display panel operates at a high source voltage.

FIG. 2 is a circuit diagram illustrating the output driver of FIG. 1.

Referring to FIG. 2, the output driver 120 is configured to selectively output the positive voltage VPOS, the negative voltage VNEG, or the ground voltage VSS according to the level of the high voltage data HV DATA_1 to HV DATA_3 provided from the level shifter 110.

The conventional EPD includes a low source voltage circuit using a low source voltage and a high source voltage circuit using a high source voltage different from the low source voltage. The circuits using two or more different source voltages in such a manner may malfunction depending on the power off sequence of the low source voltage and the high source voltage. Such a malfunction may have a fatal effect on the EPD.

FIG. 3 is a diagram illustrating a power off sequence when the low source voltage VCC is turned off before the high source voltage VPOS/VNEG in the driving circuit of the EPD.

Referring to FIG. 3, when the low source voltage VCC is first turned off, the level shifter 110 receives an abnormal signal and outputs an abnormal signal. Accordingly, the output driver 120 may output a signal at an ambiguous level, instead of the positive voltage VPOS, the negative voltage VNEG, or the ground voltage VSS.

That is, when the low source voltage VCC is turned off before the high source voltage VPOS/VNEG in the driving circuit of the EPD, the ambiguous-level output signal of the level shifter 110 is applied to an input terminal of the output driver 120, and the input terminal of the output driver 120 becomes in a floating state. Accordingly, an output terminal of the output driver 120 may also become in a floating state.

FIG. 4 is a diagram illustrating a power off sequence when the high source voltage VPOS/VNEG is turned off before the low source voltage VCC in the driving circuit of the EPD.

Referring to FIG. 4, when a strong light source is irradiated onto the EPD while the high source voltage VPOS/VNEG is turned off, a different result from a result based on an input of the level shifter 110 may be outputted due to a malfunction of the level shifter 110. Accordingly, the output driver 120 outputs a voltage at an unexpected level.

SUMMARY OF THE INVENTION

Accordingly, the present invention has been made in an effort to solve the problems occurring in the related art, and an object of the present invention is to provide an output voltage stabilization circuit of a display device driving circuit, which blocks an output of the display device driving circuit from being transmitted to a display panel when a source voltage supplied to the display device driving circuit is turned off.

Another object of the present invention is to provide an output voltage stabilization circuit of a display device driving circuit, which outputs an output signal at a ground level to a display panel, when a source voltage supplied to the display device driving circuit is turned off.

Another object of the present invention is to provide an output voltage stabilization circuit of a display device driving circuit, which detect off-states of high and low source voltages supplied to the display device driving circuit, and stabilizes the level of an output signal regardless of a power off sequence of the high and low source voltages.

In order to achieve the above object, according to one aspect of the present invention, an output voltage stabilization circuit of a display device driving circuit includes: a power off pulse generator configured to enable and output an output control signal when one of a high source voltage and a low source voltage is turned off; and an output driver configured to output an output signal to a display panel in response to a data signal provided from a level shifter, and block the output signal outputted to the display panel in response to the output control signal.

According to another aspect of the present invention, an output voltage stabilization circuit of a display device driving circuit includes: a power off pulse generator configured to receive positive and negative source voltages as a high source voltage and a low source voltage having a smaller absolute value than the high source voltage, and generate a positive control signal and a negative control signal; a level shifter configured to convert low-voltage data signals into high-voltage data signals; and an output driver configured to output an output signal having the positive source voltage, the negative source voltage, or a ground voltage in response to the positive control signal, the negative control signal, and the high-voltage data signals, wherein the output voltage stabilization circuit stabilizes a voltage of the output signal regardless of a power off sequence of the low source voltage, the positive source voltage, and the negative source voltage.

The output voltage stabilization circuit of a display device driving circuit in accordance with the embodiment of the present invention may detect a power-off state when power supplied to the display device driving circuit is turned off, thereby stabilizing the level of an output signal provided to a display panel regardless of a power off sequence.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Figure 1:
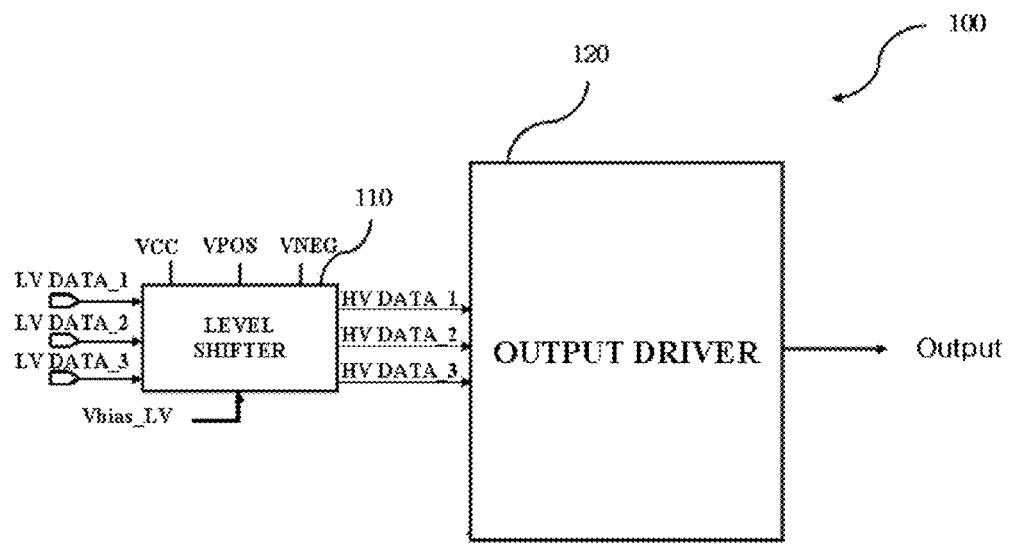
FIG. 1 is a block diagram illustrating the configuration of a driving circuit of a conventional EPD.
Figure 2:
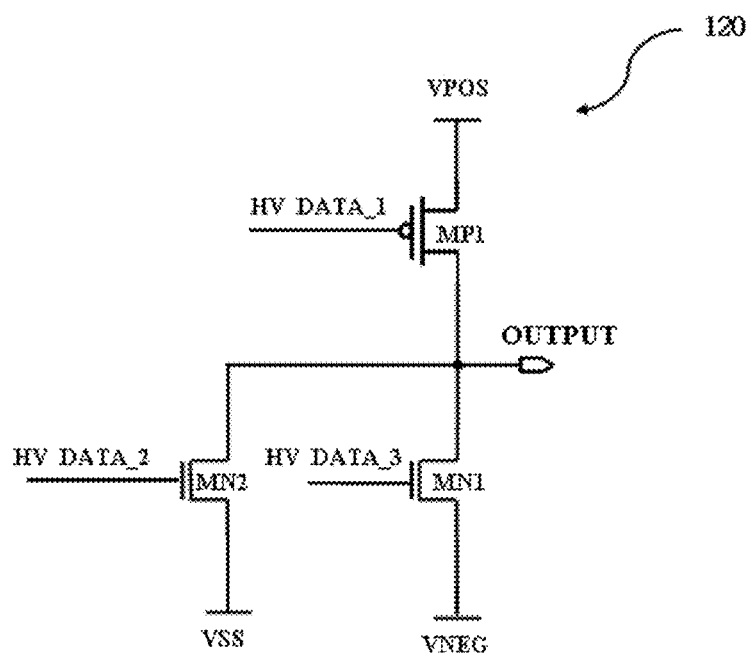
FIG. 2 is a circuit diagram illustrating the output driver of FIG. 1.

Reference will now be made in greater detail to preferred embodiments of the invention, examples of which are illustrated in the accompanying drawings. Wherever possible, the same reference numerals will be used throughout the drawings and the description to refer to the same or like parts.

In the embodiments of the present invention, a display device may include an EPD in which the output level of a driving circuit is constantly maintained after power off, in order to maintain previous data. In the embodiments of the present invention, the display device may include a display device requiring a three-phase output as well as the EPD.

Figure 5:
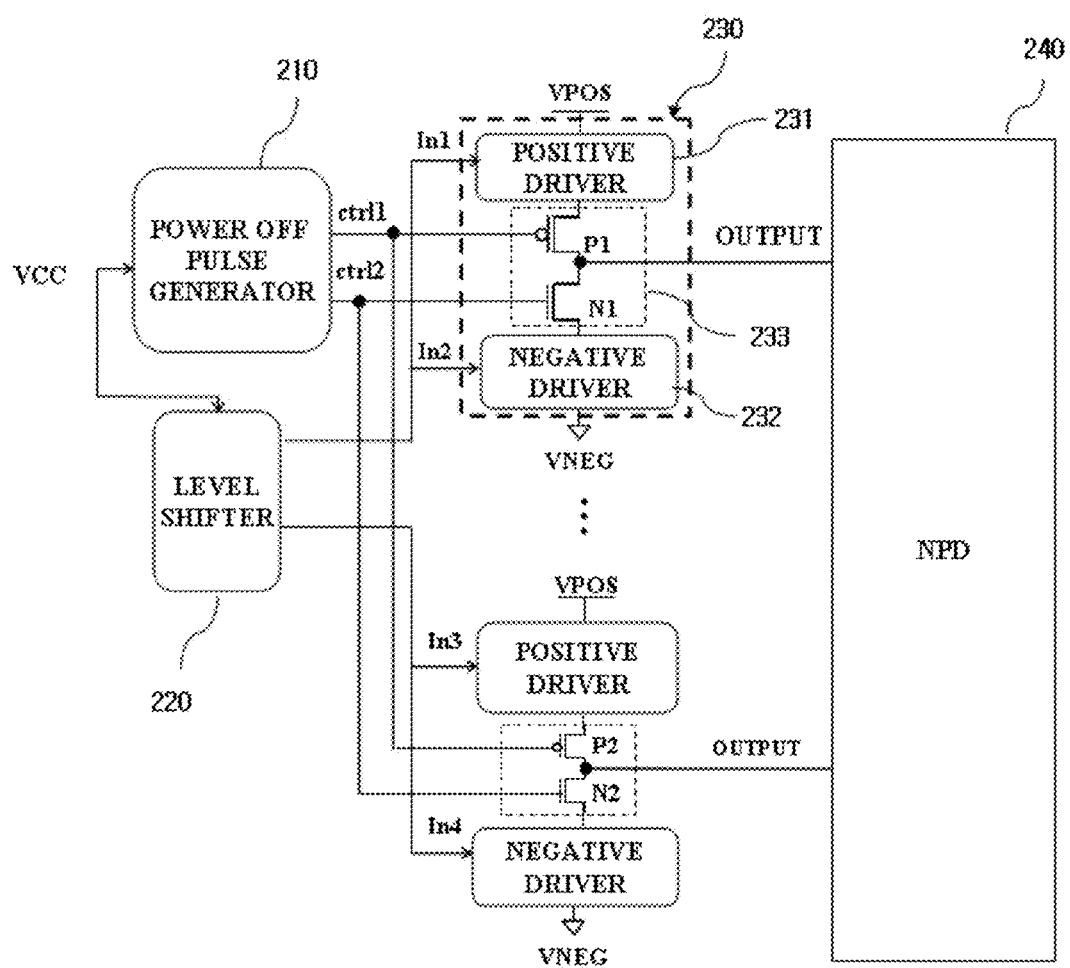
FIG. 5 is a configuration diagram illustrating an output voltage stabilization circuit of a display device driving circuit in accordance with a first embodiment of the present invention.

FIG. 5 is a configuration diagram illustrating an output voltage stabilization circuit of a display device driving circuit in accordance with a first embodiment of the present invention.

Referring to FIG. 5, the output voltage stabilization circuit of a display device driving circuit in accordance with the first embodiment of the present invention includes a power off pulse generator 210, a level shifter 220, and an output driver 230.

The level shifter 220 serves as an output controller for controlling the output driver 230, and is configured to convert low voltage data (not illustrated) into high voltage data In1 and In2 when a low source voltage VCC is turned on, and then provide the high voltage data In1 and In2 to the output driver 230.

The output driver 230 is configured to provide an output signal OUTPUT to a display panel 240 according to the high voltage data In1 and In2, in order to drive the display panel 240. The display panel 240 may include a display panel used in an EPD.

The output driver 230 includes a positive driver 231, a negative driver 232, and a switching unit 233. The positive driver 231 is configured to receive a positive voltage VPOS as a source voltage and be driven in response to first high voltage data In1 of the high voltage data In1 and In2. The negative driver 232 is configured to receive a negative voltage VNEG as a source voltage and be driven in response to second high voltage data In2 of the high voltage data In1 and In2. The first high voltage data In1 and the second high voltage data In2 may include the same signal or different signals.

The switching unit 233 is configured to transmit the output signal OUTPUT to the display panel 240 or block the transmission of the output signal OUTPUT according to output control signals ctrl1 and ctrl2 of the power off pulse generator 210. The switching unit 233 may include transistors configured to receive the output control signals ctrl1 and ctrl2 through control terminals thereof and transmit the positive source voltage VPOS and the negative source voltage VNEG to the display panel 240 or block the transmission.

For example, the switching unit 233 includes a first PMOS transistor P1 and a first NMOS transistor N1. The first PMOS transistor P1 includes a control terminal configured to receive the first output control signal ctrl1, a first terminal connected to the positive driver 231 and configured to receive the positive source voltage VPOS, and a second terminal connected to a second terminal of the first NMOS transistor N1 and the display panel 240. The first NMOS transistor N1 includes a control terminal configured to receive the second output control signal ctrl2, a first terminal connected to the negative driver 232 and configured to receive the negative source voltage VNEG, and the second terminal connected to the second terminal of the first PMOS transistor P1 and the display panel 240.

The power off pulse generator 210 is configured to enable the output control signals ctrl1 and ctrl2 when the low source voltage VCC is turned off, and output the enabled output control signals ctrl1 and ctrl2 to the switching unit 233. The output control signals ctrl1 and ctrl2 are used to control the output driver 230 not to output the output signal OUTPUT to the display panel 240.

Figure 6:
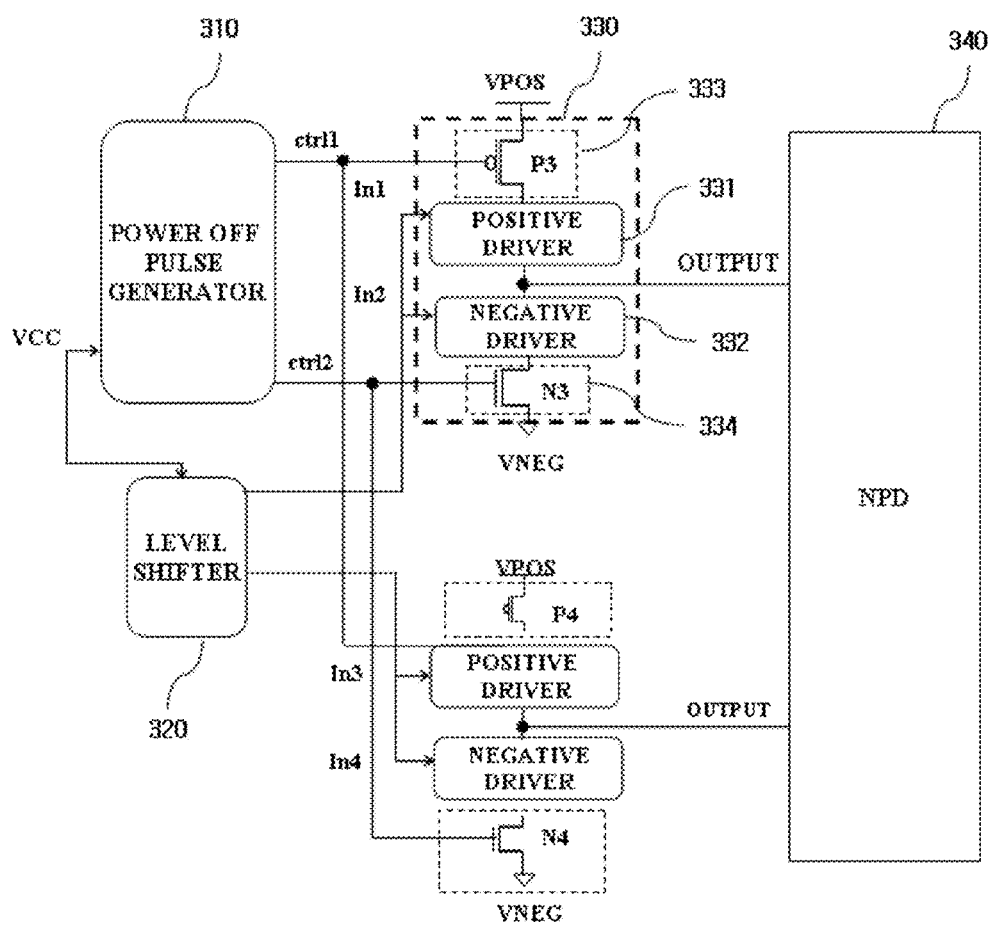
FIG. 6 is a configuration diagram illustrating another example of the output voltage stabilization circuit of a display device driving circuit in accordance with the first embodiment of the present invention.

FIG. 6 is a configuration diagram illustrating another example of the output voltage stabilization circuit of a display device driving circuit in accordance with the first embodiment of the present invention.

Referring to FIG. 6 the output voltage stabilization circuit of a display device driving circuit includes a power off pulse generator 310, a level shifter 320, and an output driver 330.

The output driver 330 is configured to provide an output signal OUTPUT to a display panel 340 according to high voltage data In1 and In2, and drive the display panel 340. The output driver 330 includes a positive driver 331, a negative driver 332, and switching units 333 and 334. The positive driver 331 is configured to receive a positive voltage VPOS as a source voltage through the first switching unit 333 and be driven in response to the first high voltage data In1. The negative driver 332 is configured to receive a negative voltage VNEG as a source voltage through the second switching unit 334 and be driven in response to the second high voltage data In2.

The switching units 333 and 334 are configured to transmit an output signal OUTPUT to the display panel 340 or block the transmission of the output signal OUTPUT according to output control signal ctrl1 and ctrl2 of the power off pulse generator 310. The switching units 333 and 334 may include a transistor configured to receive the output control signal ctrl1 through a control terminal thereof and supply the positive source voltage VPOS to the positive driver 331 or block the supply of the positive source voltage VPOS and a transistor configured to receive the output control signal ctrl2 through a control terminal thereof and supply the negative source voltage VNEG to the negative source driver 334 or block the supply of the negative source voltage.

For example, the switching units 333 and 334 include a second PMOS transistor P3 and a second NMOS transistor N3. The second PMOS transistor P3 includes a control terminal configured to receive the first output control signal ctrl1, a first terminal configured to receive the positive source voltage VPOS, and a second terminal connected to the positive driver 331. The second NMOS transistor N3 includes a control terminal configured to receive the second output control signal ctrl2, a first terminal configured to receive the negative source voltage VNEG, and a second terminal connected to the negative driver 332.

Other components such as the level shifter 320 and the power off pulse generator 310 may be easily understood by those in the art from the output voltage stabilization circuit of a display device driving circuit, which has been described with reference to FIG. 5. Therefore, the detailed descriptions thereof are omitted herein.

The output voltage stabilization circuits of a display device driving circuit in accordance with the first embodiment of the present invention, illustrated in FIGS. 5 and 6, may be provided with a plurality of output drivers outputting an output signal to the display panel and including a switching unit. The respective output drivers are driven by receiving high voltage data from the level shifter. The switching units of the respective output driver are commonly controlled by the output control signals and regulate the transmission of the output signal of the output driver to the display panel.

Now, the operation of the output voltage stabilization circuit of a display device driving circuit in accordance with the first embodiment of the present invention will be described.

Figure 3:
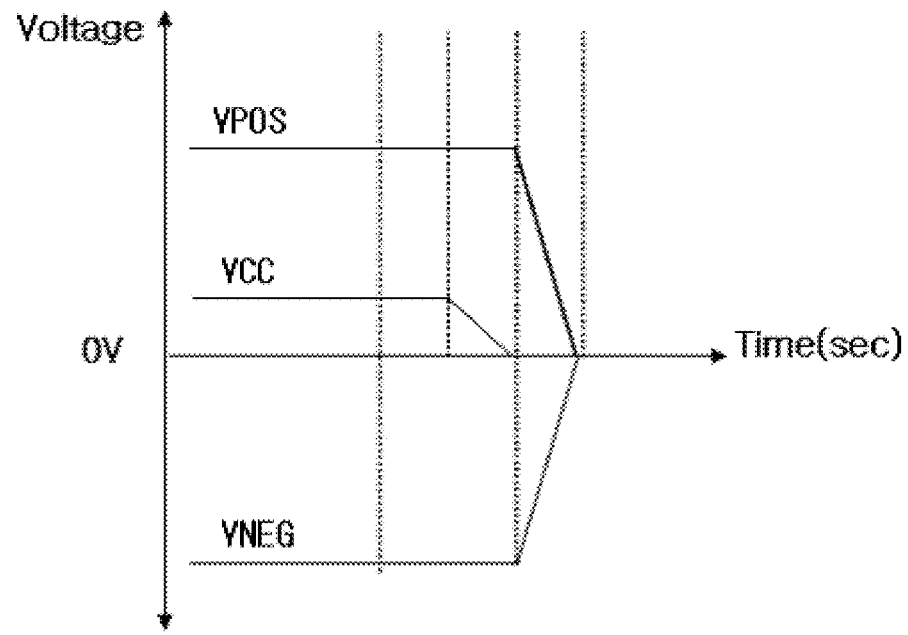
FIG. 3 is a diagram illustrating a power off sequence when a low source voltage VCC is turned off before a high source voltage VPOS/VNEG in the driving circuit of the EPD.

A case where the low source voltage VCC is first turned off and the high source voltage VPOS/VNEG is then turned off as illustrated in FIG. 3 will be described. During a period t2 where the low source voltage VCC is turned off and the high source voltage VPOS/VNEG is turned on, the level shifter 220 or 320 is not driven, and the output driver 230 or 330 is driven.

First, the operation of the output voltage stabilization circuit of a display device driving circuit, illustrated in FIG. 5, will be described. When the low source voltage VCC is turned off in the period t2, the power off pulse generator 210 enables the first output control signal ctrl1 to a high level, and enables the second output control signal ctrl2 to a low level. Therefore, the first PMOS transistor P1 and the first NMOS transistor N1 are turned off. Accordingly, although the output driver 230 is driven by abnormal high voltage data In1 and In2, the positive source voltage VPOS and the negative source voltage VNEG are not transmitted as the output signal OUTPUT to the display panel 240 by the first PMOS transistor P1 and the first NMOS transistor P1 and the first NMOS transistor N1.

The display panel 240 does not receive an ambiguous output signal from the display device driving circuit, and thus may maintain previous data.

The operation of the output voltage stabilization circuit of a display device driving circuit, illustrated in FIG. 6, may be easily understood by those in the art from the operation description of the output voltage stabilization circuit of a display device driving circuit, illustrated in FIG. 5. Therefore, the detailed descriptions thereof are omitted herein.

Figure 4:
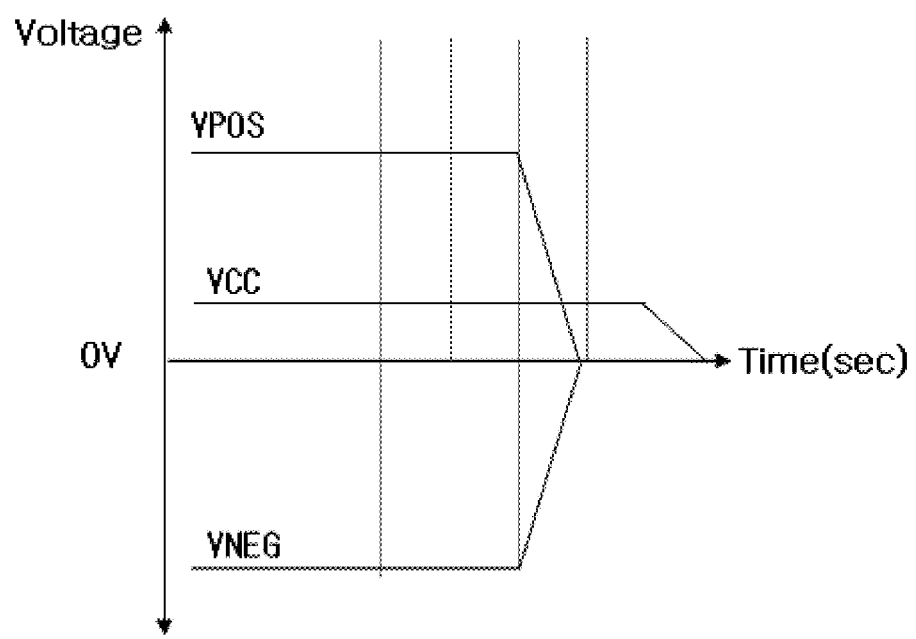
FIG. 4 is a diagram illustrating a power off sequence when the high source voltage VPOS/VNEG is turned off before the low source voltage VCC in the driving circuit of the EPD.

Next, when the power off sequence as illustrated in FIG. 4 is applied, the high source voltages, that is, the positive source voltage VPOS and the negative source voltage VNEG are first turned off. Therefore, since the output driver 230 or 330 is stopped before the level shifter 220 or 320, an abnormal output signal is not transmitted to the display panel 240 or 340.

Figure 7:
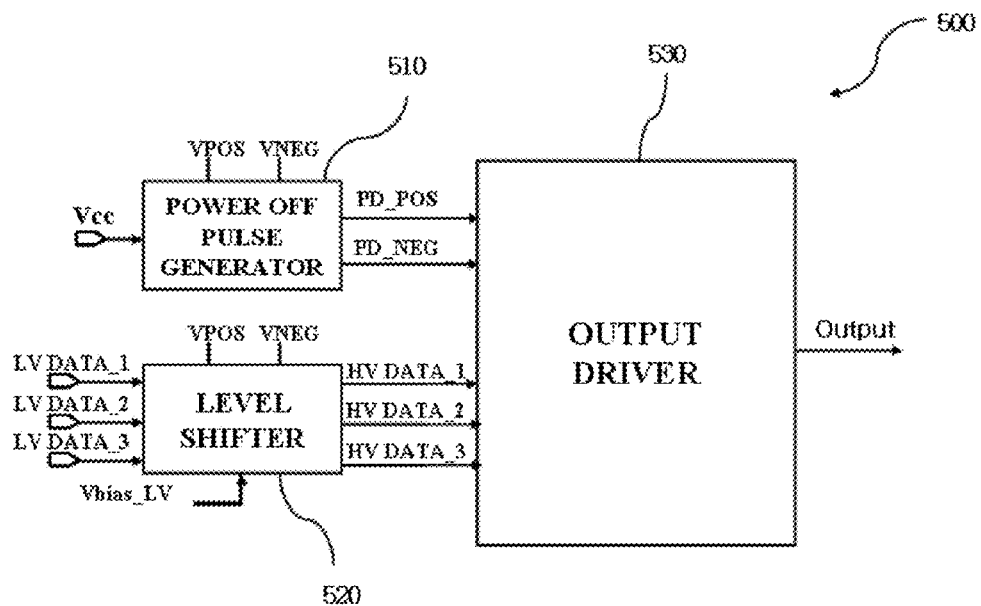
FIG. 7 is a configuration diagram illustrating an output voltage stabilization circuit of a display device driving circuit in accordance with a second embodiment of the present invention.

FIG. 7 is a configuration diagram illustrating an output voltage stabilization circuit of a display device driving circuit in accordance with a second embodiment of the present invention.

Referring to FIG. 7, the output voltage stabilization circuit 500 of a display device driving circuit in accordance with the second embodiment of the present invention includes a power off pulse generator 510, a level shifter 520, and an output driver 530.

The power off pulse generator 510 is configured to receive a positive source voltage VPOS and a negative source voltage VNEG and generate a positive control signal PD_POS and a negative control signal PD_NEG in response to a low source voltage VCC.

Here, the low source voltage VCC indicates a source voltage of a circuit (not illustrated) for supplying an input to the level shifter 520, and may include a source voltage having a low voltage (LV) level or middle voltage (MV) level, which is lower than a high source voltage. The positive source voltage VPOS and the negative source voltage VNEG, which are supplied to the output driver 530 and the level shifter 520, may include high source voltages of which the absolute value has a higher voltage level than the voltage level of the low source voltage VCC, and have characteristics of a positive voltage and a negative voltage, respectively.

The positive source voltage VPOS may include a voltage ranging from VCC to +xV (x is a positive integer more than VCC), that is, a positive voltage having a higher level than the low source voltage VCC. The negative source voltage VNEG may include a voltage ranging from −xV to −VCC, that is, a negative voltage having a lower level than the low source voltage VCC. The low source voltage VCC may have a range from the positive source voltage VPOS to the negative source voltage VNEG. The positive control signal PD_POS and the negative control signal PD_NEG are enabled and provided to the output driver 530 when one of the low source voltage VCC and the high source voltage VPOS/VNEG is turned off, and control a positive voltage switch 531 and a negative voltage switch 532, respectively.

The level shifter 520 is controlled by a bias voltage Vbias_LV generated by a bias circuit (not illustrated) using the low source voltage VCC as a source voltage. The level shifter 520 is configured to convert first to third low voltage data signals LV DATA_1 to LV DATA_3 into first to third high voltage data signals HV DATA_1 to HV DATA_3, and provide the converted signals to the output driver 530.

The output driver 530 is configured to output an output signal OUTPUT according to the first to third high voltage data signal HV DATA_1 to HV DATA_3 when the positive control signal PD_POS and the negative control signal PD_NEG are disabled, and transmit the output signal OUTPUT to a display panel (not illustrated). The display panel may include a display panel used in an EPD, for example.

Figure 8:
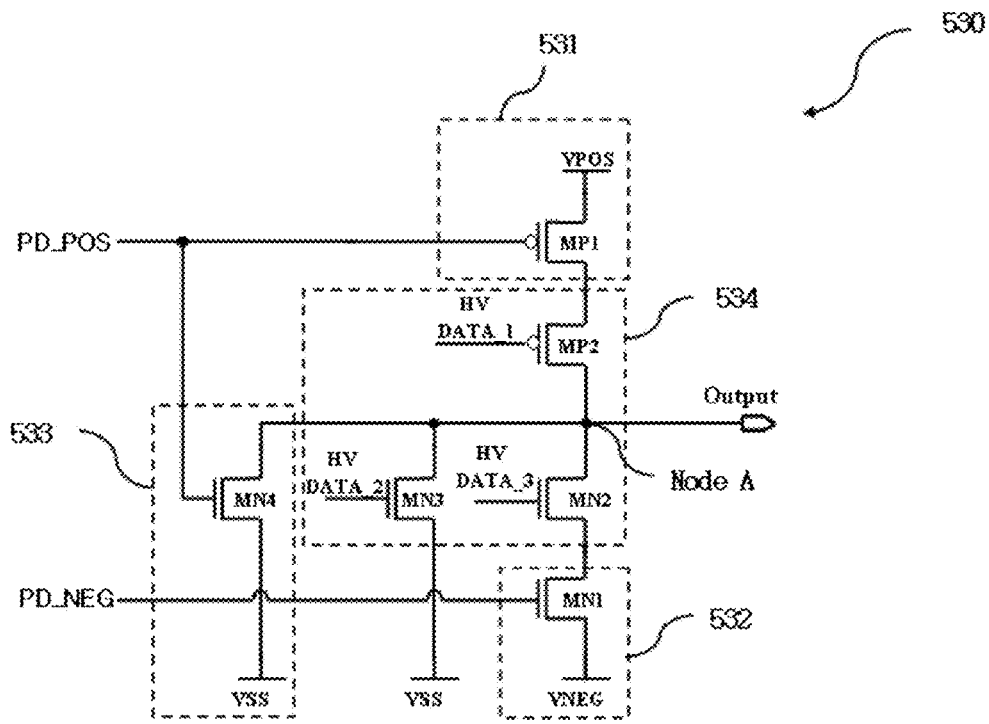
FIG. 8 is a circuit diagram illustrating an output driver of FIG. 7.

FIG. 8 is a circuit diagram illustrating the output driver of FIG. 7.

Referring to FIG. 8, the output driver 530 includes a positive voltage switch 531, a negative voltage switch 532, a ground voltage switch 533, and an output driver driving unit 534.

The positive voltage switch 531 may include a transistor MP1 configured to switch the positive source voltage VPOS to the output driver driving unit 534 in response to the positive control signal PD_POS applied to a control terminal thereof. The positive voltage switch 531 is configured to disconnect an output node A from a positive source terminal in response to the enabled positive control signal PD_POS and prevent the positive source voltage VPOS from being outputted to the output node A.

The negative voltage switch 532 may include a transistor MN1 configured to switch the negative source voltage VNEG to the output driver driving unit 534 in response to the negative control signal ND POS applied to a control terminal thereof. The negative voltage switch 532 is configured to disconnect the output node A from a negative source terminal in response to the enabled negative control signal ND NEG and prevent the negative source voltage VNEG from being outputted to the output node A.

The ground voltage switch 533 may include a transistor MN4 configured to switch a ground voltage VSS to the output driver driving unit 534 in response to the positive control signal PD_POS applied to a control terminal thereof. The ground voltage switch 533 is configured to short the output node A from a ground voltage terminal in response to the enabled positive control signal PD_POS such that the voltage level of the output node A becomes the ground voltage level VSS.

The output driver driving unit 534 includes transistors MP2, MN2, and MN3 configured to switch the positive source voltage VPOS, the negative source voltage VNEG, and the ground voltage VSS to the output node A in response to the high voltage data signals HV DATA_1 to HV DATA_3 applied to control terminals thereof, respectively. The output driver driving unit 534 is configured to receive the positive source voltage VPOS from the positive voltage switch 531 or receive the negative source voltage VNEG from the negative voltage switch 532 and output an output signal OUTPUT according to the high data signals HV DATA_1 to HV DATA_3.

When the low source voltage VCC and the high source voltage VPOS/VNEG are turned on and normally supplied, the positive control signal PD_POS becomes the negative source voltage level VNEG at a logic low level, and the negative control signal PD_NEG becomes the positive source voltage level VPOS at a logic high level. Then, the positive control signal PD_POS and the negative control signal PD_NEG are disabled. On the other hand, when any one of the low source voltage VCC and the high source voltage VPOS/VNEG is turned off, the positive control signal PD_POS becomes the positive source voltage level VPOS at a logic high level, and the negative control signal PD_NEG becomes the negative source voltage level VNEG at a logic low level. Then, the positive control signal PD_POS and the negative control signal PD_NEG are enabled.

Therefore, when any one of the low source voltage VCC and the high source voltage VPOS/VNEG is turned off, the positive voltage switch 531 and the negative voltage switch 532 of the output driver 530 are opened, and the ground voltage switch 533 is shorted. Accordingly, the voltage level of the output signal OUTPUT at the output node A is forcibly set to the ground voltage VSS such that the output signal OUTPUT maintains a stable voltage level while the power off sequence is performed.

Figure 9:
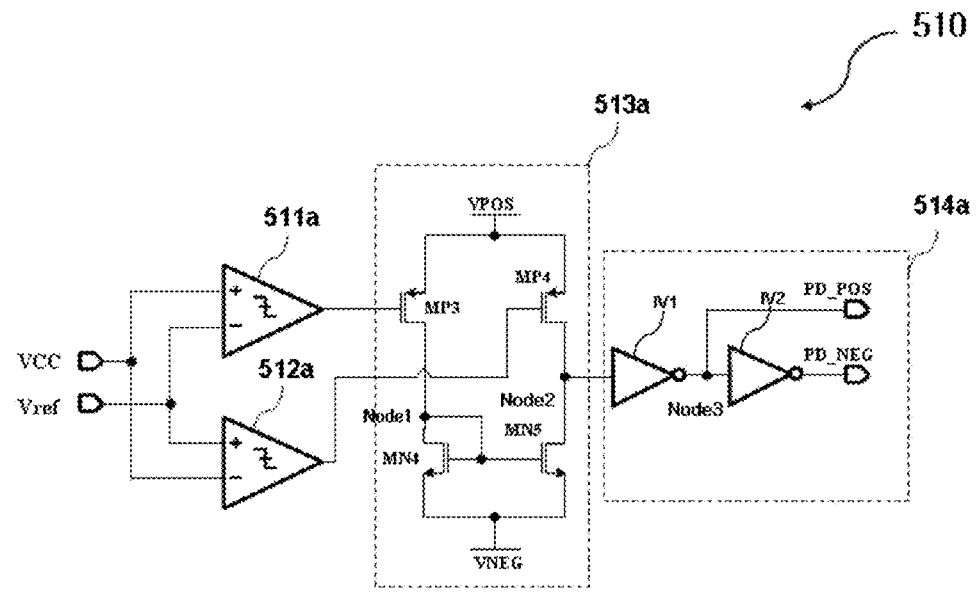
FIG. 9 is a circuit diagram illustrating a power off pulse generator of FIG. 7.

FIG. 9 is a circuit diagram illustrating the power off pulse generator of FIG. 7.

Referring to FIG. 9, the power off pulse generator 510 includes a first comparator 511a, a second comparator 512a, a third comparator 513a, and an output unit 514a.

The first comparator 511a is configured to compare the low source voltage VCC to a reference voltage Vref and output a first comparison signal. The first comparator 511a outputs a logic high first comparison signal when the low source voltage VCC is larger than the reference voltage Vref, and output a logic low first comparison signal when the low source voltage VCC is smaller than the reference voltage Vref. The first comparator 511a receives the low source voltage VCC through a noninverting terminal (+) thereof and receives the reference voltage Vref through an inverting terminal (−) thereof. The reference voltage Vref may be applied from outside or obtained through an internal bias circuit, and has a range from the ground level to the low source voltage level VCC. Desirably, the reference voltage Vref may have a voltage level of VCC/2.

The second comparator 512a is configured to compare the reference voltage Vref to the low source voltage VCC and output a second comparison signal. The second comparator 512a outputs a logic high second comparison signal when the reference voltage Vref is larger than the low source voltage VCC, and outputs a logic low second comparison signal when the reference voltage Vref is smaller than the low source voltage VCC. The second comparator 512a receives the reference voltage Vref through a noninverting terminal (+) thereof and receives the low source voltage VCC through an inverting terminal (−) thereof.

The third comparator 513a is configured to output a third comparison signal in response to the output of the first comparator 511a and the output of the second comparator 512a and. Specifically, the third comparator 513a compares the first and second comparison signals, outputs a logic high third comparison signal when the first comparison signal is larger than the second comparison signal, and outputs a logic low third comparison signal when the first comparison signal is smaller than the second comparison signal. When the third comparison signal is at a logic high level, third comparator 513a outputs the positive source voltage VPOS, and when the third comparison signal is at a logic low level, the third comparator 513a outputs the negative source voltage VNEG.

Specifically, the third comparator 513a includes a third PMOS transistor MP3, a fourth PMOS transistor MP4, a fourth NMOS transistor MN4, and a fifth NMOS transistor MN5. The third PMOS transistor MP3 includes a control terminal configured to receive the first comparison signal, a first terminal configured to receive the positive source voltage VPOS, and a second terminal connected to a first terminal of the fourth NMOS transistor MN4. The fourth PMOS transistor MP4 includes a control terminal configured to receive the second comparison signal, a first terminal configured to receive the positive source terminal VPOS, and a second terminal connected to a first terminal of the fifth NMOS transistor MN5.

The fourth NMOS transistor MN4 includes a first terminal connected to the second terminal of the third PMOS transistor MP3, a second terminal configured to receive the negative source voltage VNEG, and a control terminal connected to the first terminal. The fifth NMOS transistor MN5 includes a control terminal connected to the control terminal of the fourth NMOS transistor MN4, a first terminal connected to the second terminal of the fourth PMOS transistor MP4, and a second terminal configured to receive the negative source voltage VNEG.

The output unit 514a is configured to generate the positive control signal PD_POS by inverting the third comparison signal and generate the negative control signal PD_NEG by inverting the positive control signal PD_POS. The output unit 514a includes a first inverter IV1 and a second inverter IV2. The first inverter IV1 is configured to receive and invert the third comparison signal which is the voltage of a second node Node2, and output the positive control signal PD_POS. The second node Node2 is connected to the first terminal of the fifth NMOS transistor MN5 and the second terminal of the fourth NMOS transistor MN4.

The second inverter IV2 is configured to receive and invert the positive control signal PD_POS which is the voltage of a third node Node3, and output the negative control signal PD_NEG. The third node Node3 is connected to an output terminal of the first inverter IV1 and an input terminal of the second inverter IV2.

By a conventional differential comparator, a rail-to-rail output may not be achieved depending on process change or change in supplied voltage. However, the power off pulse generator 510 in accordance with the embodiment of the present invention may be designed to be insensitive to characteristic variations of the respective elements depending on process change or change in supplied voltage, according to a method in which the third comparator 513a compares the outputs of the differential comparators. In other words, the power off pulse generator 510 in accordance with the embodiment of the present invention may achieve a rail-to-rail output through the transistors MP3, MP4, MN4, and MN5 of the third comparator 513a, that is, the output signal of the power off pulse generator 510 may have the levels of the positive source voltage VPOS and the negative source voltage VNEG.

Hereafter, the operation of the power off pulse generator in accordance with the embodiment of the present invention will be described.

First, a case where the low source voltage VCC is first turned off and the positive source voltage VPOS and the negative source voltage VNEG are then turned off will be described. When the low source voltage VCC is turned off, the reference voltage Vref is higher than the low source voltage VCC. Therefore, the first comparator 511a outputs the logic low first comparison signal, and the second comparator 512a outputs the logic high second comparison signal. Accordingly, since the fourth PMOS transistor MP4 is turned off and the third PMOS transistor MP3 is turned on, the voltage of the second node Node2 becomes logic low. The first inverter IV1 of the output unit 514a receiving a logic low signal outputs a logic high voltage level signal as the positive control signal PD_POS, and the second inverter IV2 of the output unit 514a outputs a logic low voltage level as the negative control signal PD_NEG. Here, the logic low level may correspond to the negative source voltage level VNEG, and the logic high level may correspond to the positive source voltage level VPOS. At this time, the output driver outputs the ground voltage VSS.

Then, when the low source voltage VCC is supplied, the low source voltage VCC is higher than the reference voltage Vref. Therefore, the first comparator 511a of the power off pulse generator 510 outputs the logic high first comparison signal, and the second comparator 512a outputs the logic low second comparison signal. Accordingly, since the third PMOS transistor MP3 is turned off and the PMOS transistor MP4 is turned on, the voltage of the second node Node2 becomes logic high. The first inverter IV1 of the output unit 514a receiving a logic high signal inverts the logic high voltage of the second node and outputs the positive control signal PD_POS at a logic low level, and the second inverter IV2 outputs the negative control signal PD_NEG at a logic high level. At this time, the output driver may selectively output the low source voltage VCC, the positive source voltage VPOS, or the negative source voltage VNEG according to the first to third high voltage data.

Figure 10:
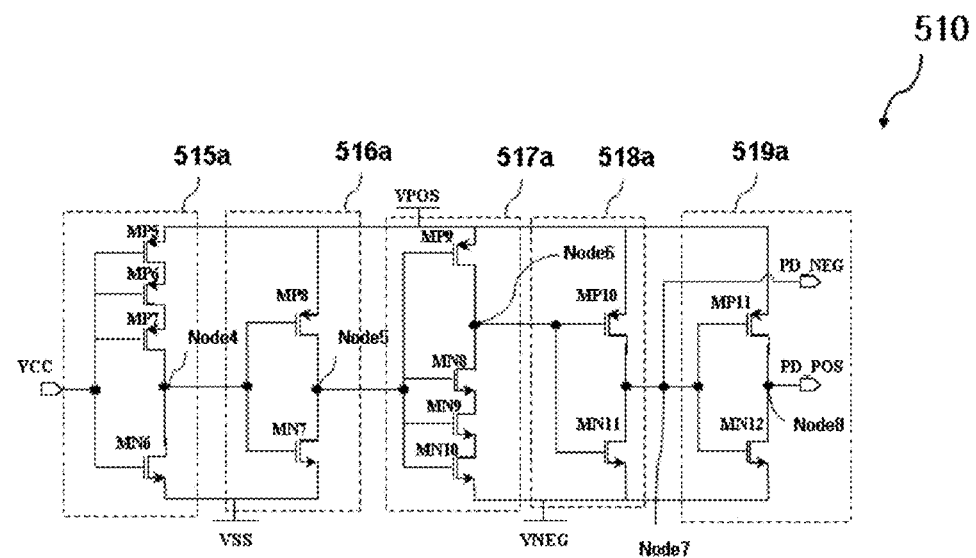
FIG. 10 is a diagram illustrating another example of the power off pulse generator of FIG. 7.

FIG. 10 is a diagram illustrating another example of the power off pulse generator of FIG. 7.

Referring to FIG. 10, the power off pulse generator 510 includes a plurality of inverting units 515a to 519a connected in series and configured to invert the logic levels of signals inputted thereto, respectively.

Among the plurality of inverting units 515a to 519a, the inverting unit 515a positioned at the front stage is configured to receive the low source voltage VCC, and the inverting units 518a and 519a positioned at the rear stage are configured to output the positive control signal PD_POS and the negative control signal PD_NEG, respectively. Among the plurality of inverting units 515a to 519a, the inverting units 515a and 516a use the positive source voltage VPOS and the ground voltage VSS as source voltages, and the inverting units 517a to 519a use the positive source voltage VPOS and the negative source voltage VNEG as source voltages.

Specifically, the power off pulse generator 510 includes the first to fifth inverting units 515a to 519a. The first inverting unit 515a includes a fifth PMOS transistor MP5, a sixth PMOS transistor MP6, a seventh PMOS transistor, and a sixth NMOS transistor MN6, which are configured to receive the low source voltage VCC through control terminals thereof. The fifth PMOS transistor MP5 receives the positive source voltage VPOS through a first terminal thereof, and the sixth NMOS transistor MN6 receives the ground voltage VSS through a second terminal thereof. A second terminal of the fifth PMOS transistor MP5 is connected to a first terminal of the sixth PMOS transistor MP6, and the second terminal of the sixth NMOS transistor MN6 is connected to a first terminal of the seventh PMOS transistor MP7. A second terminal of the seventh PMOS transistor MP7 is connected to a first terminal of the sixth NMOS transistor MN6. A fourth node Node4 connected to the second terminal of the seventh PMOS transistor MP7 and the first terminal of the sixth NMOS transistor MN6 serves as an output node of the first inverting unit 515a.

The second inverting unit 516a includes an eighth PMOS transistor MP8 and a seventh NMOS transistor MN7, of which control terminals are commonly connected to the fourth node Node4. The eighth PMOS transistor MP8 receives the positive source voltage VPOS through a first terminal thereof, and the seventh NMOS transistor MN7 receives the ground voltage VSS through a second terminal thereof. A second terminal of the eighth PMOS transistor MP8 is connected to a first terminal of the seventh NMOS transistor MN7. A fifth node Node5 connected to the second terminal of the eighth PMOS transistor MP8 and the first terminal of the seventh NMOS transistor MN7 serves as an output node of the second inverting unit 516a.

The third inverting unit 517a includes a ninth PMOS transistor MP9, an eighth NMOS transistor MN8, a ninth NMOS transistor MP9, and a tenth NMOS transistor MN10, of which control terminals are commonly connected to the fifth node Node5. The ninth PMOS transistor MP9 receives the positive source voltage VPOS through a first terminal thereof, and the tenth NMOS transistor MN10 receives the negative source voltage VNEG through a second terminal thereof. A second terminal of the ninth PMOS transistor MP9 is connected to a first terminal of the eighth NMOS transistor MN8. A sixth node Node6 connected to the second terminal of the ninth PMOS transistor MP9 and the first terminal of the eighth NMOS transistor MN8 serves as an output node of the third inverting unit 217a. A second terminal of the eighth NMOS transistor MN8 is connected to a first terminal of the ninth NMOS transistor MN9, and a second terminal of the ninth NMOS transistor MN9 is connected to a first terminal of the tenth NMOS transistor MN10.

The fourth inverting unit 518a includes a tenth PMOS transistor MP10 and an eleventh NMOS transistor MN11, of which control terminals are commonly connected to the sixth node Node6. The tenth PMOS transistor MP10 receives the positive source voltage VPOS through a first terminal thereof, and the eleventh NMOS transistor MN11 receives the negative source voltage VNEG through a second terminal thereof. A second terminal of the tenth PMOS transistor MN10 is connected to a first terminal of the eleventh NMOS transistor MN11. A seventh node Node7 connected to the second terminal of the tenth PMOS transistor MN10 and the first terminal of the eleventh NMOS transistor MN11 serves as an output node of the fourth inverting unit 518a. An output voltage of the seventh node Node7 becomes the negative control signal PD_NEG.

The fifth inverting unit 519a includes an eleventh PMOS transistor MP11 and a twelfth NMOS transistor MN12, of which control terminals are commonly connected to the seventh node Node7. The eleventh PMOS transistor MP11 receives the positive source voltage VPOS through a first terminal thereof, and the twelfth NMOS transistor MN12 receives the negative source voltage VNEG through a second terminal thereof. A second terminal of the eleventh PMOS transistor MP11 is connected to a first terminal of the twelfth NMOS transistor MN12. An eighth node Node8 connected to the second terminal of the eleventh PMOS transistor MP11 and the first terminal of the twelfth NMOS transistor MN12 serves as an output node of the power off pulse generator 510. An output voltage of the eighth node Node8 becomes the positive control signal PD_POS.

Desirably, the switching threshold voltages of the first to fifth inverting units 515a to 519a may be set to (maximum input voltage+minimum input voltage)/2. For example, the switching threshold voltage of the first inverting unit 515a may be set to (VCC+VSS)/2. In order to reduce a switching threshold voltage of VPOS/2 such that the switching threshold voltage falls within a range from the low source voltage VCC to the ground voltage VSS, the first inverting unit 515a includes the fifth to seventh PMOS transistors MP5 to MP7 connected in series. The switching threshold voltage of the third inverting unit 517a may be set to (VPOS+VSS)/2. In order to reduce a switching threshold voltage of VSS such that the switching threshold voltage falls within a range from the positive source voltage VPOS to the ground voltage VSS, the third inverting unit 517a includes the eighth to tenth NMOS transistors MN8 to MN10 connected in series.

The first to fifth inverting units 515a to 519a need to be designed to be as insensitive to process change and power change as possible. The inverting units may be designed to be insensitive to process change and power change according to the following methods. First, when the ground voltage VSS which is not varied according to change in supplied power is used as power supplied to the first and second inverting units 515a and 516a, the switching threshold voltages thereof become insensitive to the change in supplied power. Second, the six NMOS transistor MN6 may be designed in such a manner that it has a small gate-drain voltage difference. As the sixth NMOS transistor MN6 is designed using elements for the middle voltage, it is possible to stably guarantee the characteristics of the sixth NMOS transistor MN6 without having an effect on a normal operation. According to the above-described methods, it is possible to manufacture the power off pulse generator 510 having stable characteristics despite variation in process condition or change in supplied power.

Hereafter, the operation of the power off pulse generator in accordance with the embodiment of the present invention will be described.

When the low source voltage VCC is turned off, the fifth to seventh PMOS transistors MP5 to MP7 are turned on, and the sixth NMOS transistor MN6 is turned off. Then, the voltage of the fourth node Node4 becomes the positive source voltage VPOS. Since the eighth PMOS transistor MP9 is turned off and the seventh NMOS transistor MN7 is turned on, the voltage level of the fifth node Node5 becomes the ground voltage VSS.

The ninth PMOS transistor MP9 is turned on, and the eighth to tenth NMOS transistors MN8 to MN10 are turned off. Then, the voltage of the sixth node Node6 has the same level as or lower by a predetermined level than the positive source voltage VPOS. Accordingly, the tenth PMOS transistor MP10 is turned off, and the eleventh NMOS transistor MN11 is turned on. Then, the voltage of the seventh node Node7 becomes the logic low negative source voltage VNEG.

The logic low voltage of the seventh node Node7 is outputted as the negative control signal PD_NEG. The fifth inverting unit 519a inverts the negative control signal PD_NEG and outputs the logic high positive control signal PD_POS. At this time, the output driver outputs the ground voltage VSS.

As described above, when the low source voltage VCC is turned off, the power off pulse generator 510 in accordance with the embodiment of the present invention outputs the positive control signal PD_POS corresponding to the positive source voltage level VPOS and the negative control signal PD_NEG corresponding to the negative source voltage level VNEG, thereby sensing the power-off of the low source voltage VCC. The output driver may stabilize the output using the positive control signal PD_POS and the negative control signal PD_NEG of the power off pulse generator 510.

Figure 11:
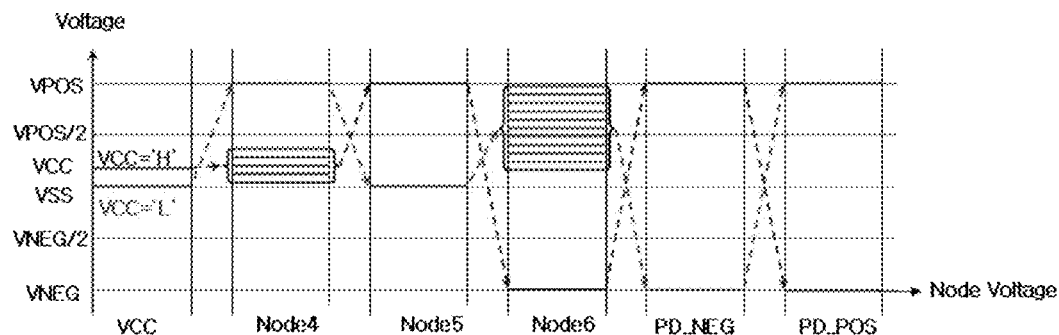
FIG. 11 is a diagram illustrating voltages at the respective nodes of the power off pulse generator of FIG. 10.

FIG. 11 is a diagram illustrating voltages at the respective nodes of the power off pulse generator of FIG. 10.

Referring to FIG. 11, when the low source voltage VCC is at a logic high level, the voltage of the fourth node Node4 may have a range from the ground voltage VSS to a voltage higher by a predetermined level than the ground voltage VSS, depending on change in process condition or supplied power. When the low source voltage VCC is at a logic low level, the voltage of the sixth node Node6 may have a range from the positive source voltage VPOS to a voltage lower by a predetermined level than the positive ground voltage VPOS, depending on change in process condition or supplied power.

That is, the voltages of the fourth and sixth nodes Node4 and Node6 have a predetermined range depending on change in process condition or supplied power. The power off pulse generator 510 may normally operate within the range. Therefore, the power off pulse generator 510 may output the positive control signal PD_POS and the negative control signal PD_NEG as accurate values, despite the change in process condition or supplied power.

Figure 12:
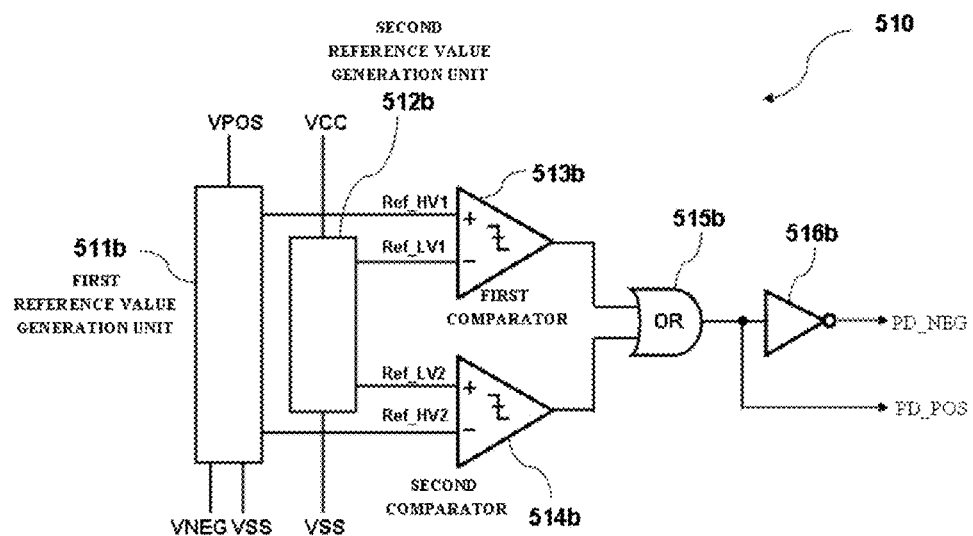
FIG. 12 is a diagram illustrating another example of the power off pulse generator of FIG. 7.

FIG. 12 is a diagram illustrating another example of the power off pulse generator of FIG. 7.

Referring to FIG. 12, the power off pulse generator 510 includes a first reference value generation unit 511b, a second reference value generation unit 512b, a first comparator 513b, a second comparator 514b, an OR gate 515B, and an inverter 516b.

The first reference value generation unit 511b is configured to receive the high source voltages VPOS and VNEG and generate a first high-potential reference voltage Ref_HV1 and a second high-potential reference voltage Ref_HV2 which are applied to the first comparator 513b and the second comparator 514b, respectively.

The second reference generation value unit 512b is configured to receive the low source voltage VCC and generate a first low-potential reference voltage Ref_LV1 and a second low-potential reference voltage Ref_LV2 which are applied to the first comparator 513b and the second comparator 514b, respectively.

The first comparator 513b is configured to compare the first high-potential reference voltage Ref_HV1 and the first low-potential reference voltage Ref_LV1, generated by the first and second reference value generation units 511b and 512b, respectively, and output a first comparison signal. The first comparator 513b receives the first high-potential reference voltage Ref_HV1 through a noninverting terminal thereof, and receives the first low-potential reference voltage Ref_LV1 through an inverting terminal thereof. In a state where the source voltage is normally applied, the first high-potential reference voltage Ref_HV1 is higher than the first low-potential reference voltage Ref_LV1. Therefore, the first comparator 513b outputs a logic high signal. While power is turned off according to the power off sequence, the magnitudes of the first high-potential reference voltage Ref_HV1 and the first low-potential reference voltage Ref_LV1 are inverted, and the first comparison signal is outputted as a logic low inverted value.

The second comparator 514b is configured to compare the second high-potential reference voltage Ref_HV2 and the second low-potential reference voltage Ref_LV2, generated by the first and second reference value generation units 511b and 512b, respectively, and output a second comparison signal. The second comparator 514b receives the second low-potential reference voltage Ref_LV2 through a noninverting terminal thereof, and receives the second high-potential reference voltage Ref_HV2 through an inverting terminal thereof. In a state where the source voltage is normally applied, the second high-potential reference voltage Ref_HV2 is higher than the second low-potential reference voltage Ref_LV2. Therefore, the second comparator 513b outputs a logic low signal. While power is turned off according to the power off sequence, the magnitudes of the second high-potential reference voltage Ref_HV2 and the second low-potential reference voltage Ref_LV2 are inverted, and the second comparison signal is outputted as a logic high inverted value.

The OR gate 515b is configured to receive the first and second comparison signals, perform an OR operation on the received signals, and output the positive control signal PD_POS. The inverter 516b is configured to invert the positive control signal PD_POS and output the negative control signal PD_NEG.

As described above, although only any one of the outputs of the first and second comparators 513b and 514b is inverted, the logic levels of the positive control signal PD_POS and the negative control signal PD_NEG, which are the control signals of the output driver, are inverted. Therefore, when power is turned off regardless of the sequence where the low source voltage VCC and the high source voltage VPOS/VNEG are turned off, the output of the power off pulse generator 510 is inverted and outputted.

Hereafter, the operation of the power off pulse generator 510 in accordance with the embodiment of the present invention will be described.

When the low source voltage VCC is first turned off and the positive source voltage VPOS and the negative source voltage VNEG are then turned off, the first low-potential reference voltage Ref_LV1 is higher than the first high-potential reference voltage Ref_HV1. Therefore, the first comparator 513b outputs the logic low first comparison signal. Meanwhile, since the second low-potential reference voltage Ref_LV2 is higher than the second high-potential reference voltage Ref_HV2, the second comparator 514b outputs the logic high second comparison signal. The OR gate 515b receiving the logic low first comparison signal and logic high second comparison signal outputs a logic high signal.

Therefore, the positive control signal PD_POS is outputted at a logic high voltage level, and the negative control signal PD_NEG is outputted at a logic low voltage level. The logic low voltage level corresponds to the negative source voltage level VNEG, and the logic high voltage level corresponds to the positive source voltage level VPOS.

Meanwhile, when the positive source voltage VPOS and the negative source voltage VNEG are first turned off and the low source voltage VCC is then turned off, the first high-potential reference voltage Ref_HV1 is higher than the first low-potential reference voltage Ref_LV1. Therefore, the first comparator 513b outputs the logic high first comparison signal. Since the second high-potential reference voltage Ref_HV2 is higher than the second low-potential reference voltage Ref_LV2, the second comparator 514b outputs the logic low second comparison signal. The OR gate 515b receiving the logic high first comparison signal and the logic low second comparison signal outputs a logic high signal. Therefore, the positive control signal PD_POS is outputted at a logic high voltage level, and the negative control signal PD_NEG is outputted at a logic low voltage level.

In the output driver 530 illustrated in FIG. 7, the first PMOS transistor MP1 of the positive voltage switch 531 and the first NMOS transistor MN1 of the negative voltage switch 532 are turned off, and the fourth NMOS transistor MN4 of the ground voltage switch 534 is turned on. Accordingly, the ground voltage VSS is outputted from the output node of the output driver 530, regardless of the power off sequence of the high source voltage VPOS/VNEG and the low source voltage VCC.

Figure 13:
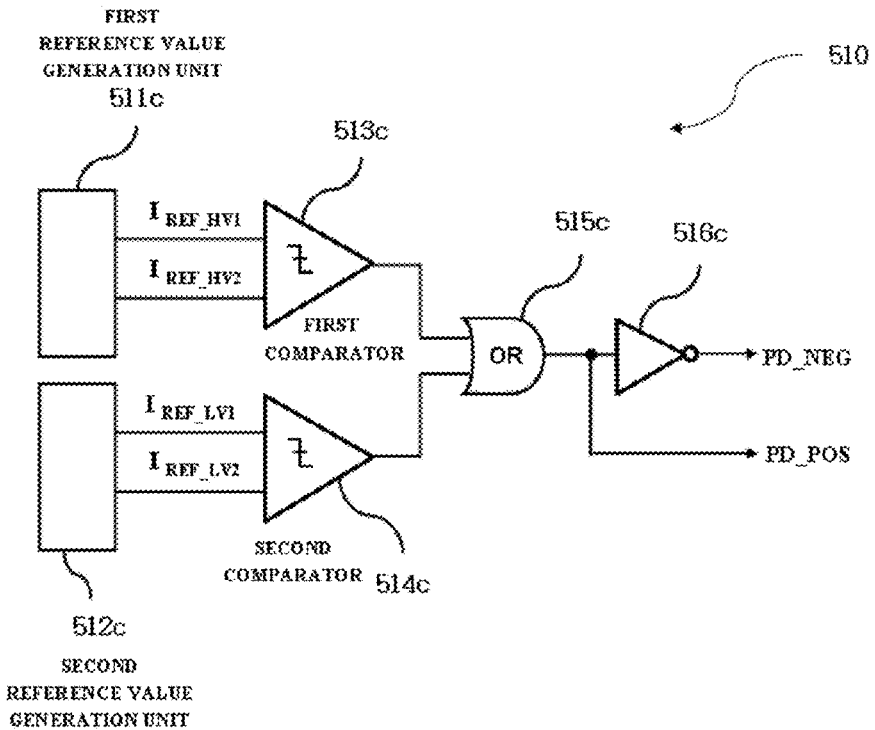
FIG. 13 is a circuit diagram illustrating another example of the power off pulse generator of FIG. 7.

FIG. 13 is a circuit diagram illustrating another example of the power off pulse generator of FIG. 7.

Referring to FIG. 13, the power off pulse generator 510 in the output voltage stabilization circuit of the display device driving circuit in accordance with the embodiment of the present invention includes a first reference value generation unit 511c, a second reference value generation unit 512c, a first comparator 513c, a second comparator 514c, an OR gate 515c, and a first inverter 516c.

The first reference voltage generation unit 511c is configured to generate first and second high-voltage reference currents $I_{REF\_HV1}$ and $I_{REF\_HV2}$ dependent on the magnitude of the high source voltage VPOS/VNEG, using a low-voltage current source independent of the magnitude of the high source voltage VPOS/VNEG. When the level of the high source voltage VPOS/VNEG decreases, the first reference voltage generation unit 511c detects the decrease, and inverts and outputs the magnitudes of the first and second high-voltage reference currents $I_{REF\_HV1}$ and $I_{REF\_HV2}$.

The second reference value generation unit 512c is configured to generate first and second low-voltage reference currents $I_{REF\_LV1}$ and $I_{REF\_LV2}$ dependent on the magnitude of the low source voltage VCC, using a high-voltage current source independent of the magnitude of the low source voltage VCC. When the level of the low source voltage VCC decreases, the second reference voltage generation unit 512c detects the decrease, and inverts and outputs the magnitudes of the first and second low-voltage reference currents $I_{REF\_LV1}$ and $I_{REF\_LV2}$.

The first comparator 513c compares the first and second high-voltage reference currents $I_{REF\_HV1}$ and $I_{REF\_HV2}$. When the magnitudes of the first and second high-voltage reference currents $I_{REF\_HV1}$ and $I_{REF\_HV2}$ are inverted and inputted, the first comparator 513c inverts an output and outputs the inverted output as a first comparison signal.

The second comparator 514c compares the first and second low-voltage reference currents $I_{REF\_LV1}$ and $I_{REF\_LV1}$. When the magnitudes of the first and second low-voltage reference currents $I_{REF\_LV1}$ and $I_{REF\_LV2}$ are inverted and inputted, the second comparator 514c inverts an output and outputs the inverted output as a second comparison signal.

The OR gate 515c is configured to receive the first and second comparison signals, perform an OR operation on the received signals, and output the positive control signal PD_POS.

The first inverter 516c inverts the positive control signal PD_POS which is the output of the OR gate 515c, and outputs the inverted signal as the negative control signal PD_NEG.

Figure 14:
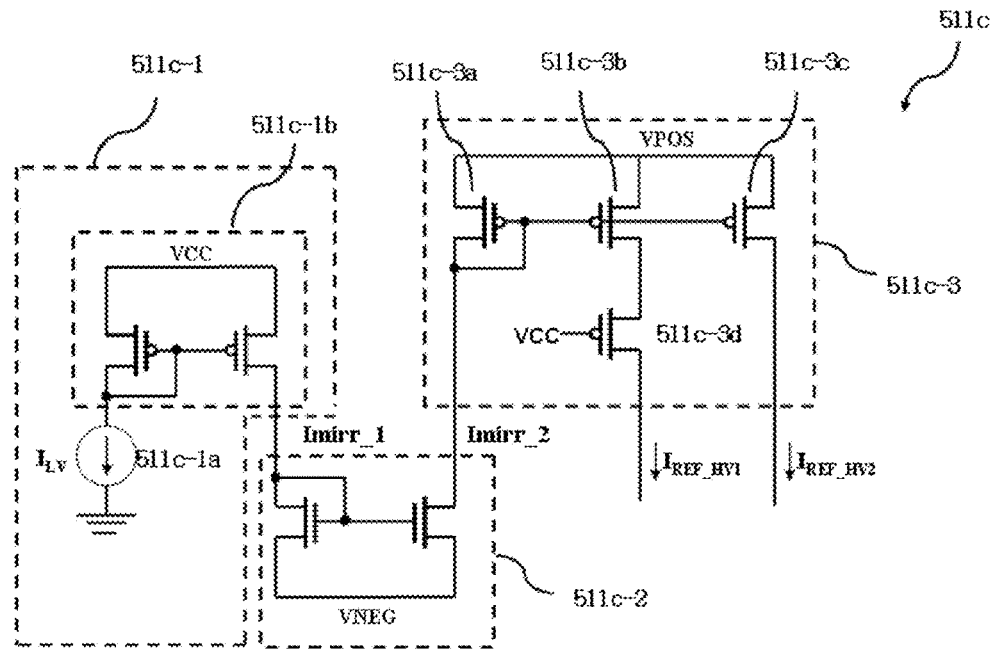
FIG. 14 is a circuit diagram illustrating a first reference value generation unit of FIG. 13.

FIG. 14 is a circuit diagram illustrating the first reference value generation unit of FIG. 13.

Referring to FIG. 14, the first reference value generation unit 511c includes a first current mirror section 511c-1, a second current mirror section 511c-2, and a third current mirror section 511c-3.

The first current mirror section 511c-1 includes a low-voltage current source 511c-1a independent of the magnitude of the high source voltage VPOS/VNEG and a first current mirror 511c-1b having low-voltage MOS transistors using the low source voltage VCC as a source voltage, and is configured to mirror a reference current $I_{LV}$ generated by the low-voltage current source 511c-1a through the first current mirror 511c-1b, and output a first mirrored current $I_{mirr\_1}$.

The second current mirror section 511c-2 includes MOS transistors using the negative source voltage VNEG as a source voltage, and is configured to mirror the first mirrored current $I_{mirr\_1}$ and output a second mirrored current $I_{mirr\_2}$.

The third current mirror section 511c-3 is configured to mirror the second mirrored current $I_{mirr\_2}$ and generate the first and second high-voltage reference currents $I_{REF\_HV1}$ and $I_{REF\_HV2}$.

In this case, the third current mirror section 511c-3 includes first to fourth PMOS transistors 511c-3a to 511c-3d using the positive source voltage VPOS as a source voltage.

The first PMOS transistor 511c-3a has a gate and drain connected to an output terminal of the second current mirror section 511c-2, from which the second mirrored current $I_{mirr\_2}$ is outputted. The second PMOS transistor 511c-3b has a gate connected to a gate of the first PMOS transistor 511c-3a and a source connected to the positive source voltage VPOS.

The third PMOS transistor 511c-3c has a gate connected to the gate of the first PMOS transistor 511c-3a, a source connected to the positive source voltage VPOS, and a drain through which the second high-voltage reference current $I_{REF\_HV2}$ flows.

The fourth PMOS transistor 511c-3d has a source connected to a drain of the second PMOS transistor 511c-3b, a gate connected to the low source voltage VCC, and a drain through which the first high-voltage reference current $I_{REF\_HV1}$ flows.

The first and third PMOS transistors 511c-3a and 511c-3c may have the same magnitude, and the second PMOS transistor 511c-3b may have a larger magnitude than the first and third PMOS transistors 511c-3a and 511c-3c.

When the positive source voltage VPOS is normally supplied, the first reference value generation unit 511c mirrors the reference current $I_{LV}$ generated by the low-voltage current source 511c-1a through the first to third current mirror sections 511c-1 to 511c-3, and outputs the first and second high-voltage reference currents $I_{REF\_HV1}$ and $I_{REF\_HV2}$. Since the second PMOS transistor 511c-3b where the first high-voltage reference current $I_{REF\_HV1}$ flows is larger than the third PMOS transistor 511c-3c where the second high-voltage reference current $I_{REF\_HV2}$, the first high-voltage reference current $I_{REF\_HV1}$ in a normal state is larger than the second high-voltage reference current $I_{REF\_HV2}$.

On the other hand, when the positive source voltage VPOS is turned off and the source voltage level decreases, the gate-source voltage of the fourth transistor 511c-3d decreases. Accordingly, the first high-voltage reference current $I_{REF\_HV1}$ flowing in the fourth transistor 511c-3d rapidly decreases, and the magnitudes of the first and second high-voltage reference currents $I_{REF\_HV1}$ and $I_{REF\_HV2}$ are inverted.

As described above, the first reference value generation unit 511c may generate the first and second high-voltage reference currents $I_{REF\_HV1}$ and $I_{REF\_HV2}$ dependent on the high source voltage VPOS, that is, capable of detecting the off state of the high source voltage VPOS, using the low-voltage current source 511c-1a independent of the magnitude of the high source voltage VPOS/VNEG.

From the descriptions based on this embodiment of the present invention in which the first reference value generation unit 511c generates the first and second high-voltage reference currents $I_{REF\_HV1}$ and $I_{REF\_HV2}$ dependent on the positive source voltage VPOS, it may be easily understood by those in the art that the reference value generation unit may generate the first and second high-voltage reference currents $I_{REF\_HV1}$ and $I_{REF\_HV2}$ dependent on the negative source voltage VNEG. For example, when the positive source voltage VPOS of the third current mirror section 511c-3 is replaced with the negative source voltage VNEG and the PMOS transistors forming the third current mirror section 511c-3 are replaced with NMOS transistors, it is possible to generate the first and second high-voltage reference currents $I_{REF\_HV1}$ and $I_{REF\_HV2}$ dependent on the negative source voltage VNEG. At this time, the gate of the NMOS transistor corresponding to the fourth PMOS transistor 511c-3d may receive the ground voltage VSS.

Figure 15:
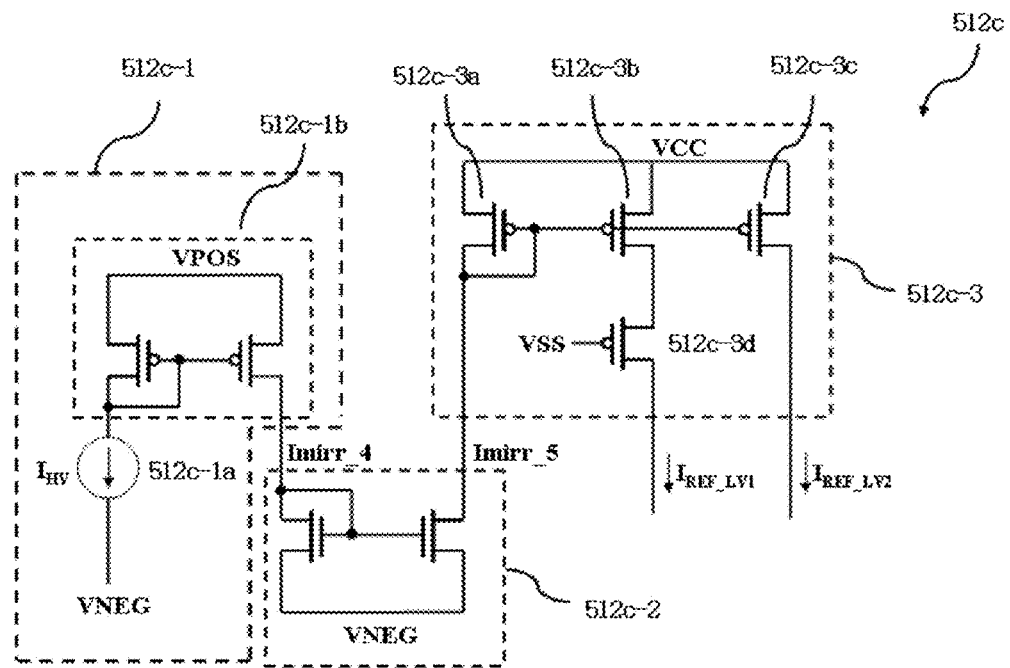
FIG. 15 is a circuit diagram illustrating a second reference value generation unit of FIG. 13.

FIG. 15 is a circuit diagram illustrating the second reference value generation unit of FIG. 13.

Referring to FIG. 15, the second reference value generation unit 512c is configured to generate first and second low-voltage reference currents $I_{REF\_LV1}$ and $I_{REF\_LV2}$ dependent on the magnitude of the low source voltage VCC, using a high-voltage current source independent of the magnitude of the low source voltage VCC.

The second reference value generation unit 512c includes fourth to sixth current mirror sections 512c-1 to 512c-3.

The fourth current mirror section 512c-1 includes a high-voltage current source 512c-1a and a fourth current mirror 512c-1b having high-voltage MOS transistors using the positive source voltage VPOS as a source voltage, and is configured to mirror a reference current $I_{HV}$ generated by the high-voltage current source 512c-1a through the fourth current mirror 512c-1b and output a fourth mirrored current $I_{mirr\_4}$.

The fifth current mirror section 512c-2 includes MOS transistors using the negative source voltage VNEG as a source voltage, and is configured to mirror the fourth mirrored current $I_{mirr\_4}$ and output a fifth mirrored current $I_{mirr\_5}$. The sixth current mirror section 512c-3 is configured to mirror the fifth mirrored current $I_{mirr\_5}$ and generate the first and second low potential reference currents $I_{REF\_HV1}$ and $I_{REF\_HV2}$.

In this case, the sixth current mirror section 512c-3 includes fifth to eighth PMOS transistors 512c-3a to 512c-3d using the low source voltage VCC as a source voltage.

The fifth PMOS transistor 512c-3a has a gate and drain connected to an output terminal of the fifth current mirror section 512c-2, from which the fifth mirrored current $I_{mirr\_5}$ is outputted. The sixth PMOS transistor 512c-3b has a gate connected to the gate of the fifth PMOS transistor 512c-3a and a source connected to the low source voltage VCC.

The seventh PMOS transistor 512c-3c has a gate connected to the gate of the fifth PMOS transistor 512c-3a, a source connected to the low source voltage VCC, and a drain through which the second low potential reference current $I_{REF\_HV2}$ flows.

The eighth PMOS transistor 512c-3d has a source connected to a drain of the sixth PMOS transistor 512c-3b, a gate connected to the ground voltage VSS, and a drain through which the first low-voltage reference current $I_{REF\_HV1}$ flows.

The fifth and seventh PMOS transistors 512c-3a and 512c-3c may have the same magnitude, and the sixth PMOS transistor 512c-3b may have a larger magnitude than the fifth and seventh PMOS transistor 512c-3a and 512c-3c.

When the low source voltage VCC is normally supplied and when the low source voltage VCC is turned off and the source voltage level decreases, the operation of the second reference generation unit 512c may be easily understood by those in the art from the operation descriptions of the first reference value generation unit 511c of FIG. 14. Therefore, the detailed descriptions thereof are omitted herein.

Figure 16:
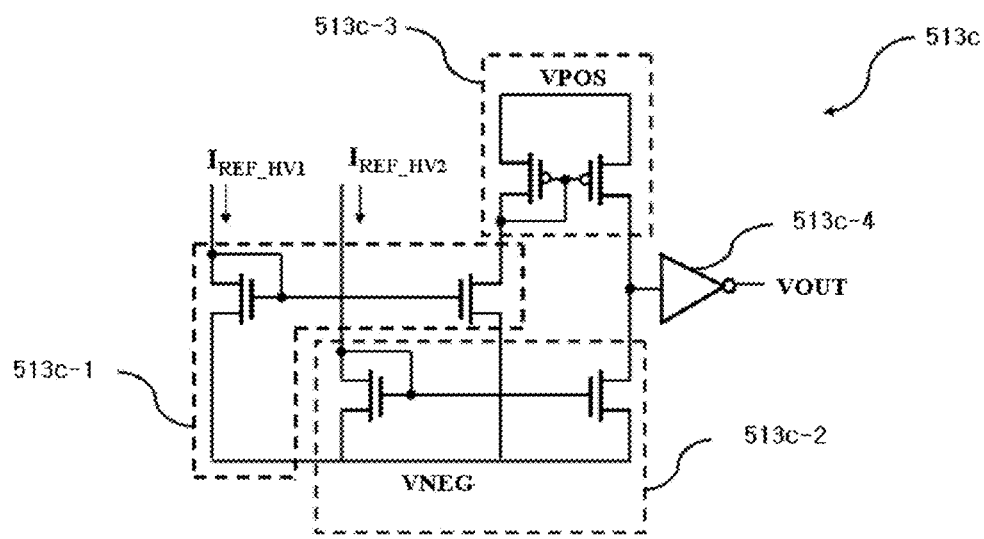
FIG. 16 is a circuit diagram illustrating a first comparator of FIG. 13.

FIG. 16 is a circuit diagram illustrating the first comparator of FIG. 13.

Referring to FIG. 16, the first comparator 513c includes a seventh current mirror section 513c-1, an eighth current mirror section 513c-2, a ninth current mirror section 513c-3, and a second inverter 513c-4.

The seventh current mirror section 513c-1 is configured to mirror the first high-voltage reference current $I_{REF\_HV1}$ and output the primarily-mirrored first high-voltage reference current $I_{REF\_HV1}$, and the eighth current mirror section 513c-2 is configured to mirror the second high-voltage reference current $I_{REF\_HV2}$ and output the primarily-mirrored second high-voltage reference current $I_{REF\_2}$.

The ninth current mirror section 513c-3 is configured to mirror the primarily-mirrored first high-voltage reference current $I_{REF\_HV1}$ and output the secondarily-mirrored first high-voltage reference current $I_{REF\_HV2}$. The second inverter 513c-4 is configured to compare the secondarily-mirrored first high-voltage reference current $I_{REF\_HV1}$ and the primarily-mirrored second high-voltage reference current $I_{REF\_HV2}$, and output the first comparison signal.

At this time, the second inverter 513c-4 outputs the negative source voltage VNEG when the secondarily-mirrored first high-voltage reference current $I_{REF\_HV1}$ is larger than the primarily-mirrored second high-voltage reference current $I_{REF\_HV2}$, and outputs the positive source voltage VPOS when the secondarily-mirrored first high-voltage reference current $I_{REF\_HV2}$ is smaller than the primarily-mirrored second high-voltage reference current $I_{REF\_HV2}$.

Figure 17:
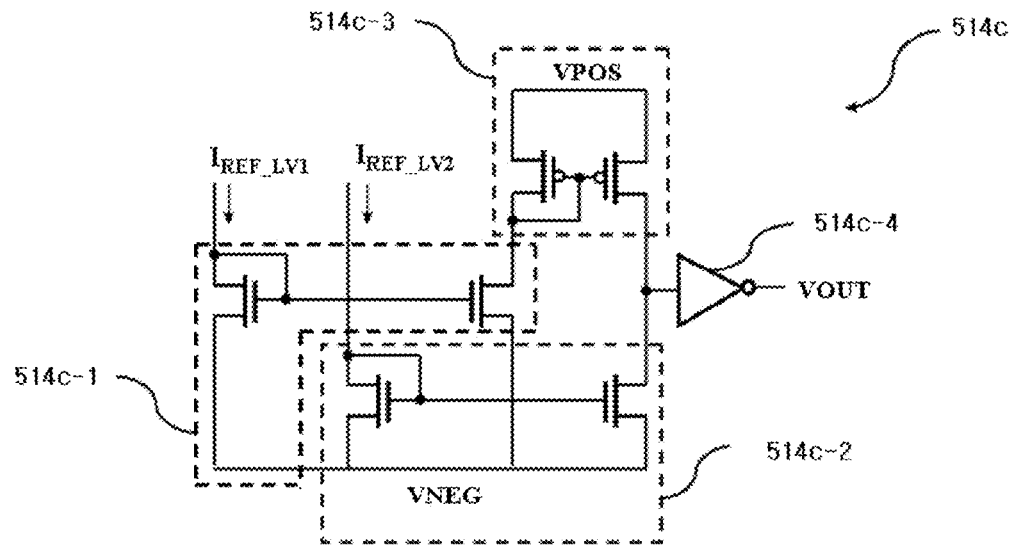
FIG. 17 is a circuit diagram illustrating a second comparator of FIG. 13.

FIG. 17 is a circuit diagram illustrating the second comparator of FIG. 13.

Referring to FIG. 17, the second comparator 514c includes a tenth current mirror section 514c-1, an eleventh current mirror section 514c-2, a twelfth current mirror section 514c-3, and a third inverter 514c-4.

The tenth current mirror section 514c-1 is configured to mirror the first low-voltage reference current $I_{REF\_LV1}$ and output the primarily-mirrored first low-voltage reference current $I_{REF\_LV1}$. The eleventh current mirror section 514c-2 is configured to mirror the second low-voltage reference current $I_{REF\_HV2}$ and output the primarily-mirrored second low-voltage reference current $I_{REF\_LV2}$.

The twelfth current mirror section 514c-3 is configured to mirror the primarily-mirrored first low-voltage reference current $I_{REF\_LV1}$ and output the secondarily-mirrored first low-voltage reference current $I_{REF\_LV1}$. The third inverter 514c-4 is configured to compare the secondarily-mirrored first low-voltage reference current $I_{REF\_LV1}$ to the primarily-mirrored second low-voltage reference current $I_{REF\_LV2}$ and output the second comparison signal.

At this time, the third inverter 514c-4 outputs the negative source voltage VNEG when the secondarily-mirrored first low-voltage reference current $I_{REF\_LV1}$ is larger than the primarily-mirrored second low-voltage reference current $I_{REF\_LV2}$, and outputs the positive source voltage VPOS when the secondarily-mirrored first low-voltage reference current $I_{REF\_LV1}$ is smaller than the primarily-mirrored second low-voltage reference current $I_{REF\_LV1}$.

Figure 18:
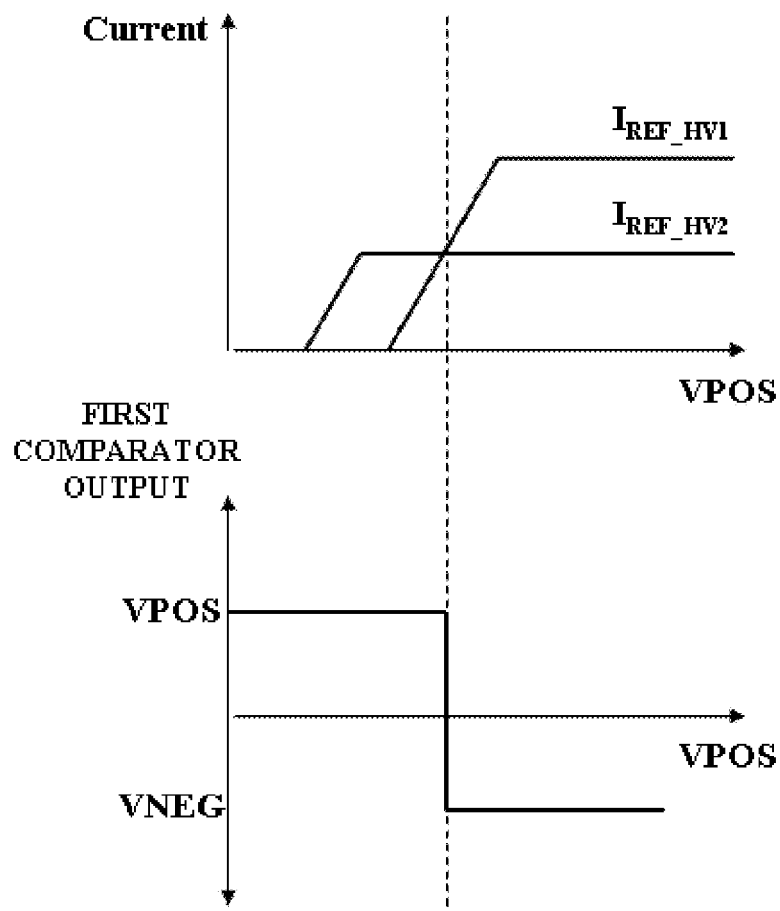
FIG. 18 is a diagram illustrating the relationship between an output of the first comparator and change in current magnitude of the first reference value generation unit according to a positive source voltage.

FIG. 18 is a diagram illustrating the relationship between the output of the first comparator and change in current magnitude of the first reference value generation unit according to the positive source voltage.

Referring to FIG. 18, it can be seen that, in a normal state, the first high-voltage reference current $I_{REF\_HV1}$ is larger than the second high-voltage reference current $I_{REF\_HV2}$, and the first comparator 513c outputs the negative source voltage VNEG as the first comparison signal. However, as the positive source voltage VPOS decreases, the magnitudes of the first and second high-voltage reference currents $I_{REF\_HV1}$ and $I_{REF\_HV2}$ are reversed, and the positive source voltage VPOS is outputted as the first comparison signal.

Figure 19:
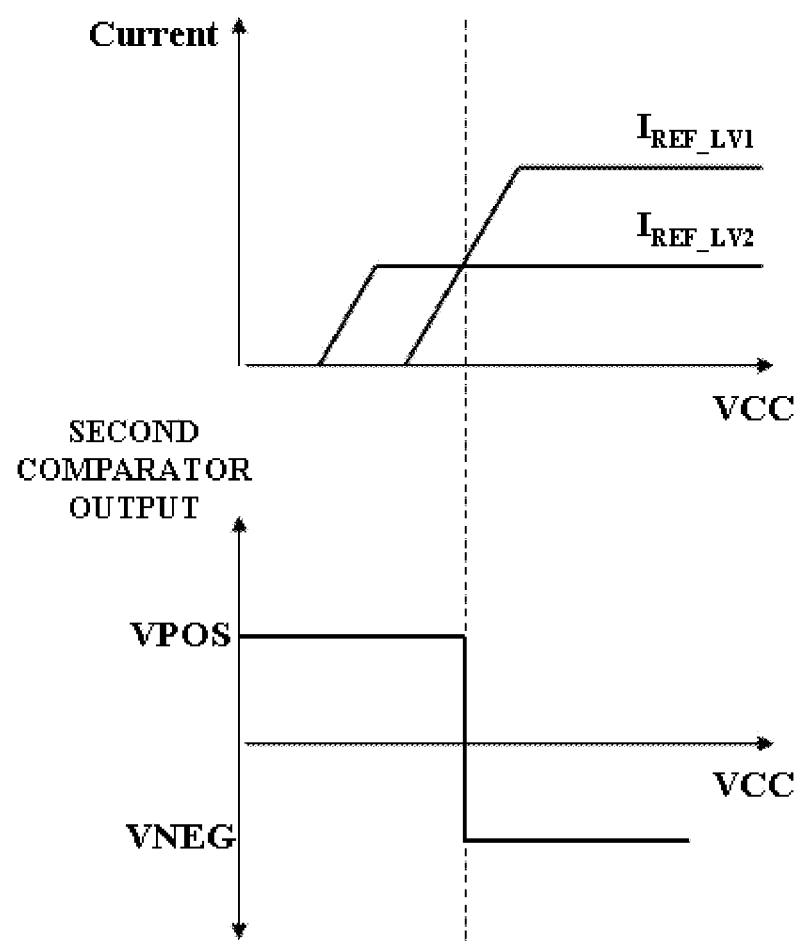
FIG. 19 is a diagram illustrating the relationship between an output of the second comparator and change in current magnitude of the second reference value generation unit according to the positive source voltage.

FIG. 19 is a diagram illustrating the relationship between the output of the second comparator and change in current magnitude of the second reference value generation unit according to the positive source voltage.

Referring to FIG. 19, it can be seen that, in a normal state, the first low-voltage reference current $I_{REF\_LV1}$ is larger than the second low-voltage reference current $I_{REF\_LV2}$, and the second comparator 514c outputs the negative source voltage VNEG as the second comparison signal. However, as the low source voltage VCC decreases, the magnitudes of the first and second low-voltage reference currents $I_{REF\_LV1}$ and $I_{REF\_LV2}$ are reversed, and the positive source voltage VPOS is outputted as the second comparison signal.

That is, when the positive source voltage VPOS and the negative source voltage VNEG are turned off before the low source voltage VCC, the positive source voltage VPOS is outputted as the first comparison signal. Therefore, the positive control signal PD_POS which is an output of the OR gate 515c of the power off pulse generator 510 is outputted as the logic high positive source voltage VPOS.

Meanwhile, when the low source voltage VCC is turned off before the positive source voltage VPOS and the negative source voltage VNEG, the positive source voltage VPOS is outputted as the second comparison signal. Therefore, the positive control signal PD_POS which is an output of the OR gate 515c of the power off pulse generator 510 is outputted as the logic high positive source voltage VPOS.

As described above, when the low source voltage VCC is first turned off, the second comparator 514c outputs the logic high positive source voltage VPOS, and when the high source voltage VPOS/VNEG is first turned off, the first comparator 513c outputs the logic high positive source voltage VPOS. Therefore, although only any one of the output of the first comparator 513c and the output of the second comparator 514c is inverted, the positive control signal PD_POS which is a control signal of the output driver 530 has a logic high value, and the negative control signal PD_NEG has a logic low value.

In the output voltage stabilization circuits in accordance with the embodiments of the present invention, when the power off sequence is performed regardless of an order in which the low source voltage and the high source voltage are turned off, the positive control signal PD_POS has a logic high value, and the negative control signal PD_NEG has a logic low value. Accordingly, the output node OUTPUT of the output driver 530 outputs the ground voltage VSS.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. An output voltage stabilization circuit of a display device driving circuit, comprising:
   a power off pulse generator configured to receive positive source voltages and negative source voltages as a high source voltage, receive a low source voltage having a smaller absolute value than the high source voltage, and generate a positive control signal and a negative control signal;
   a level shifter configured to convert low-voltage data signals into high-voltage data signals; and
   an output driver configured to output an output signal having the positive source voltage, the negative source voltage, or a ground voltage in response to the positive control signal, the negative control signal, and the high-voltage data signals,
   wherein the output voltage stabilization circuit stabilizes a voltage of the output signal regardless of a power off sequence of the low source voltage, the positive source voltage, and the negative source voltage, the output driver comprises:
   an output driver driving unit configured to output the output signal in response to the high-voltage data signals,
   a positive voltage switch configured to supply, in response to the positive control signal, the positive source voltage to the output driver driving unit, and
   a negative voltage switch configured to supply, in response to the negative control signal, the negative source voltage to the output driver driving unit, wherein
   the output driver driving unit outputs the positive source voltage or the negative source voltage as the output signal.

2. The output voltage stabilization circuit of claim 1, wherein the output driver further comprises a ground voltage switch configured to supply or block the ground voltage in response to the positive control signal.

3. The output voltage stabilization circuit of claim 1, wherein the power off pulse generator comprises:
   a first comparator configured to receive the low source voltage through a noninverting terminal thereof, receive a reference voltage through an inverting terminal thereof, compare the low source voltage to the reference voltage, and output a first comparison signal;
   a second comparator configured to receive the low source voltage through an inverting terminal, receive the reference voltage through a noninverting terminal, compare the low source voltage to the reference voltage, and output a second comparison signal;
   a third comparator configured to compare the output of the first comparator to the output of the second comparator and output a third comparison signal; and
   an output unit configured to generate the positive control signal by inverting the third comparison signal, and generate the negative control signal by inverting the positive control signal.

4. The output voltage stabilization circuit of claim 1, wherein the power off pulse generator comprises first to fifth inverting units connected in series,
   the first and second inverting units use the positive source voltage and the ground voltage as source voltages, and
   the third to fifth inverting units use the positive source voltage and the negative source voltage as source voltages.

5. The output voltage stabilization circuit of claim 4, wherein the first inverting unit comprises a PMOS transistor and an NMOS transistor, of which control terminals are configured to receive the low source voltage, and
the PMOS transistor includes a plurality of PMOS transistors connected in series to reduce a switching threshold voltage.

6. The output voltage stabilization circuit of claim 5, wherein the third inverting unit comprises a PMOS transistor and an NMOS transistor, of which control terminals are configured to receive an output of the second inverting unit, and
the NMOS transistor includes a plurality of NMOS transistors connected in series to raise a switching threshold voltage.

7. The output voltage stabilization circuit of claim 1, wherein the power off pulse generator comprises:
a first reference value generation unit configured to receive the positive source voltage and the negative source voltage and generate a first high-potential reference voltage and a second high-potential reference voltage;
a second reference value generation unit configured to receive the low source voltage and generate a first low-potential reference voltage and a second low-potential reference voltage;
a first comparator configured to receive the first high-potential reference voltage through a noninverting terminal thereof, receive the first low-potential reference voltage through an inverting terminal thereof, compare the first high-potential reference voltage to the first low-potential reference voltage, and output a first comparison signal;
a second comparator configured to receive the second high-potential reference voltage through an inverting terminal thereof, receive the second low-potential reference voltage through a noninverting terminal, compare the second high-potential reference voltage to the second low-potential reference voltage, and output a second comparison signal; and
an OR gate and an inverter configured to output the positive control signal and the negative control signal using the first comparison signal and the second comparison signal.

8. The output voltage stabilization circuit of claim 1, wherein the power off pulse generator comprises:
a first reference value generation unit configured to generate first and second high-voltage reference currents using a current source independent of the positive source voltage and the negative source voltage, and invert magnitudes of the first and second high-voltage reference currents when the levels of the positive source voltage and the negative source voltage decrease; and
a first comparator configured to output a first comparison signal by comparing the magnitudes of the first and second high-voltage reference currents, and invert and output the first comparison signal when the magnitudes of the first and second high-voltage reference currents are inverted.

9. The output voltage stabilization circuit of claim 1, wherein the power off pulse generator comprises:
a second reference value generation unit configured to generate first and second low-voltage reference currents using a current source independent of the low source voltage, and invert magnitudes of the first and second low-voltage reference currents when the level of the low source voltage decreases; and
a second comparator configured to output a second comparison signal by comparing the magnitudes of the first and second low-voltage reference currents, and invert and output the second comparison signal when the magnitudes of the first and second low-voltage reference currents are inverted.

10. The output voltage stabilization circuit of claim 1, wherein the power off pulse generator comprises:
a first reference value generation unit configured to generate first and second high-voltage reference currents using a current source independent of the positive source voltage and the negative source voltage, and invert magnitudes of the first and second high-voltage reference currents when the levels of the positive source voltage and the negative source voltage decrease;
a first comparator configured to output a first comparison signal by comparing the magnitudes of the first and second high-voltage reference currents, and invert and the first comparison signal when the magnitudes of the first and second high-voltage reference currents are inverted;
a second reference value generation unit configured to generate first and second low-voltage reference currents using a current source independent of the low source voltage, and invert magnitudes of the first and second low-voltage reference currents when the level of the low source voltage decreases;
a second comparator configured to output a second comparison signal by comparing the magnitudes of the first and second low-voltage reference currents, and invert and output the second comparison signal when the magnitudes of the first and second low-voltage reference currents are inverted; and
an OR gate configured to perform an OR operation on the first and second comparison signals and output the positive control signal.

11. The output voltage stabilization circuit of claim 1, wherein the output driver outputs a ground voltage when the positive control signal and negative control signal are enabled.

* * * * *